United States Patent [15] 3,696,302
Gossard [45] Oct. 3, 1972

[54] UHF-VHF VARACTOR TUNER AMPLIFYING BAND CONVERSION

[72] Inventor: Thomas F. Gossard, Studio City, Calif.

[73] Assignee: Standard Kollsman Industries, Inc., Melrose Park, Ill.

[22] Filed: Oct. 30, 1970

[21] Appl. No.: 85,583

[52] U.S. Cl. ..................325/432, 325/439, 325/461, 334/15

[51] Int. Cl. ..........................................H04b 1/26

[58] Field of Search.........178/5.8, DIG. 13; 325/308, 325/430, 431, 432, 433, 439, 461, 436; 334/1, 15

[56] References Cited

UNITED STATES PATENTS

| | | | |
|---|---|---|---|
| 2,529,443 | 11/1950 | Bach | 325/433 |
| 3,555,430 | 1/1971 | Fischer et al. | 325/308 |
| 3,573,631 | 4/1971 | Carlson | 325/464 |
| 3,207,990 | 8/1965 | Nestlerode | 325/436 |
| 2,902,598 | 9/1959 | Hills | 325/461 |
| 3,242,433 | 3/1966 | Carlson et al. | 325/461 |

*Primary Examiner*—Benedict V. Safourek
*Attorney*—E. Manning Giles, J. Patrick Cagney, Michael A. Kondzella and Richard A. Zachar

[57] ABSTRACT

An all channel television tuner comprises separate UHF and VHF sections each utilizing voltage controlled diode capacitance tuning and being operable to select a corresponding input signal and band converting the same in inverted relation to an intermediate frequency of about 230 MHz and a second mixer section for converting from 230 MHz to the standard IF television signal.

8 Claims, 2 Drawing Figures

INVENTOR
Thomas T. Gossard
BY J. Patrick Cagney
ATTORNEY

UHF-VHF VARACTOR TUNER AMPLIFYING BAND CONVERSION

BACKGROUND OF THE INVENTION

Wittig U.S. Pat. No. 3,354,397 and Gossard et al. U.S. applications Ser. Nos. 671,011 and 839,163 (B–207 and B–207A) disclose voltage controlled VHF tuner circuits utilizing varactor diodes for channel tuning and utilizing additional diodes for switching between the low VHF band and the high VHF band. Manicki U.S. Pat. application, Ser. No. 839,169 (B–254) shows a voltage controlled UHF tuner circuit utilizing varactor diodes for channel tuning.

In these circuit arrangements, there is a requirement for varactor diodes having high Q, having high capacitance ratios, for example, 5 to 1, and having a uniformity in electrical characteristics to insure close tracking of the tunable circuits. The band switching feature of the Wittig and Gossard references represents one important approach for reducing the tuning capacitance ratios required for VHF tuners. However, this is accomplished at the expense of utilizing additional switching diodes. The UHF tuner circuitry of the aforesaid Manicki application accomplishes tuning without need for band switching but is subject to performance degradation unless the varactor diodes are of high Q.

Accordingly, there is a need for a television tuner circuit arrangement employing varactor diodes and capable of functioning effectively where the varactor diodes are not of high Q or do not have high tuning capacitance ratios.

SUMMARY OF THE INVENTION

The present invention provides a solution to the above-described need in the form of a tuner circuit arrangement utilizing varactor diodes in conjunction with a double conversion tuning system.

In the illustrated arrangement, an all channel television tuning system is provided which utilizes a double conversion technique, both for the VHF band and for the UHF band.

The invention provides a tuner arrangement comprising band pass filter means for selecting input signals within a predetermined band of television frequencies, means for converting an input signal from the filter means to a predetermined intermediate frequency that is above the VHF television band and including local oscillator means having voltage controlled diode capacitance tuning for providing an oscillator signal variable over a frequency band above the predetermined intermediate frequency and mixer means coupled to receive the input signal and the oscillator signal to produce the predetermined intermediate frequency as a difference frequency signal, and means for converting the predetermined intermediate frequency signal to a standard intermediate frequency television signal and including local oscillator means for providing a fixed frequency oscillator signal and mixer means coupled to receive the predetermined intermediate frequency signal and the fixed frequency oscillator signal to produce the standard intermediate frequency television signal as a different signal.

In particular, an all channel tuner arrangement is provided as including a VHF section for selecting input signals in the VHF television band and converting the same in inverted relation to a predetermined intermediate frequency of about 230 MHz, a UHF section for selecting input signals in the UHF television band and converting the same in inverted relation to a predetermined intermediate frequency of about 230 MHz, and switching means operable to selectively control connection of one of the UHF and VHF sections.

In the illustrated all channel television tuner, the predetermined intermediate frequency is about 230 MHz. This places the lowest UHF image frequency above the UHF television band and it also places the VHF image responses well above the VHF television band to facilitate the rejection of unwanted frequencies by the use of conventional band pass filters.

Other features and advantages of the invention will be apparent from the following description and claims and are illustrated in the accompanying drawings which show structure embodying preferred features of the present invention and the principles thereof, and what is now considered to be the best mode in which to apply these principles.

BRIEF DESCRIPTION OF THE DRAWINGS

In the accompanying drawings forming a part of the specification, and in which like numerals are employed to designate like parts throughout the same.

DETAILED DESCRIPTION OF ALL CHANNEL TV TUNER

Figure 1:
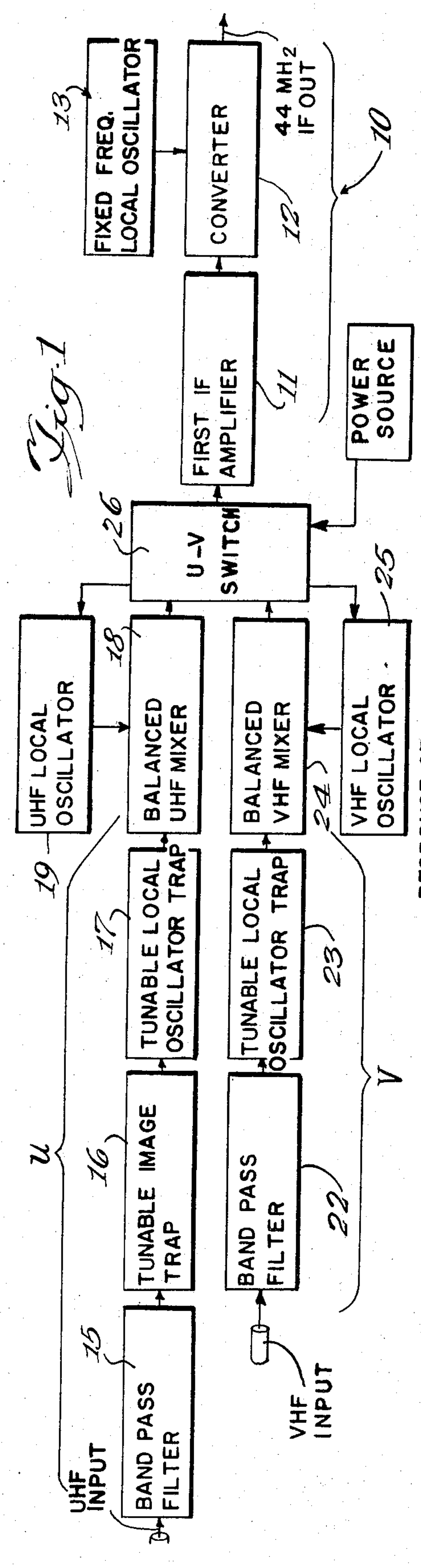
FIG. 1 is a block diagram illustration of an all channel TV tuner.

Referring now to the drawings and particularly to FIG. 1, an embodiment of an all channel TV tuner system is shown in block diagram as including a UHF tuner section U, a VHF tuner section V, either of which can be coupled to an IF amplifier-converter section 10 that includes a first IF amplifier 11, and a converter 12 supplied from a fixed frequency local oscillator 13 and functioning to convert the first IF frequency to the standard IF frequency of 44 MHz for supply to a conventional TV receiver.

In the illustrated arrangement, the UHF tuner section is shown as including a band pass filter 15, a tunable image trap 16, a tunable local oscillator trap 17, and a balanced UHF mixer 18 which receives input from a variable frequency UHF local oscillator 19 and provides output to the IF amplifier-converter section 10 via U/V switch 26. These elements of the UHF tuner section may be arranged in different sequence as will be apparent to those skilled in this art.

In the illustrated arrangement, the VHF tuner section is shown as including a band pass filter 22, a tunable local oscillator trap 23, and a balanced VHF mixer 24 which is supplied with input from a variable frequency VHF local oscillator 25.

The variable frequency traps 16 and 17 are tuned in conjunction with the UHF local oscillator 19. Similarly, the variable frequency local oscillator trap 23 is turned in conjunction with the VHF local oscillator 25.

The outputs from the UHF and VHF tuner sections are fed to the U/V switching network 26 for selectively controlling coupling of either the VHF output or the UHF output to the IF converter section 10. The switching network 26 functions in ganged relationship with the tuner sections U,V so that when control voltages are applied to the variable frequency components 16, 17 and 19, the switching network 26 is connected to supply UHF output to the IF amplifier-converter section 10.

Figure 2:
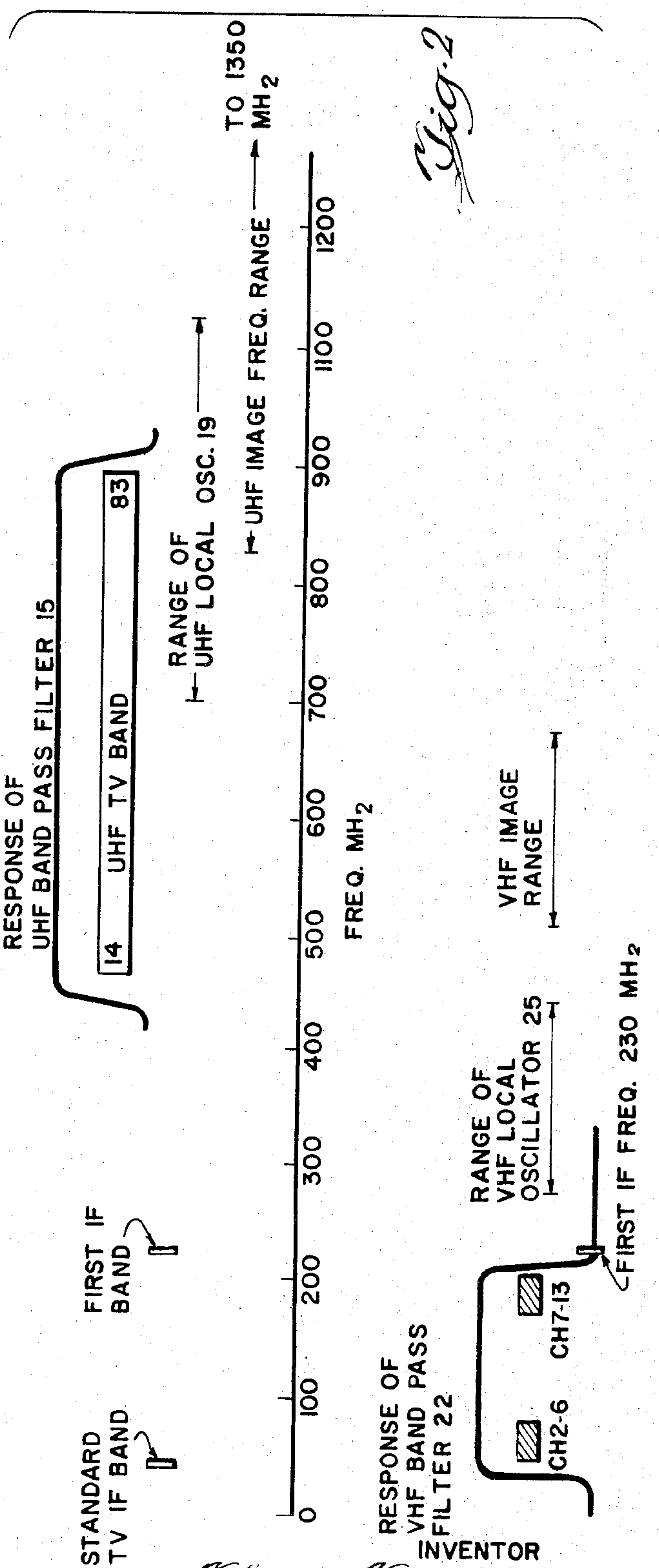
FIG. 2 is a chart illustrating the operating ranges of the main components of the tuner of FIG. 1.

The first IF amplifier 11 is functionally equivalent to conventional tuner circuitry in that it includes a band pass network in the input, an RF amplifier, and a band pass network in the output. In the illustrated arrangement, an AGC voltage is connected to the first IF amplifier to control its RF amplifier which operates at a single fixed frequency, preferably about 230 MHz or higher. The frequency ranges of the various signals and image responses are depicted in the chart of FIG. 2 to aid in illustrating the operating characteristics of the disclosed embodiment for the case where the first IF frequency is 230 MHz.

In the practice of the present invention, the output frequency of the first IF amplifier 11 is selected both to place the lowest UHF image frequency above the UHF television band, and to place the VHF image responses well above the VHF television band. In addition, the frequency range of the VHF local oscillator 25 is above the entire VHF band by a substantial amount, so that rejection of the local oscillator signal is readily provided by the band pass filter 22. The band pass filter 22 of the VHF section also rejects the VHF image responses.

It may be noted in the particular arrangement illustrated that the band pass filter 15 of the UHF section rejects all of the UHF image responses and provides additional rejection for the UHF local oscillator frequencies that are above the cutoff frequency of the band pass filter. The use of a first IF amplifier 11 operating at a frequency of 230 MHz has an important advantage in that it is easily accommodated to present day technology. Where technology and economics would permit, the frequency of the first IF converter 11 could be chosen sufficiently high to increase the portion of the UHF local oscillator frequency range that is above the UHF band, analogous to the frequency relationships described for the VHF arrangement. With present day technology, the selectivity and rejection of the local oscillator signal is better achieved by operating at an IF frequency of 230 MHz.

The system illustrated herein has favorable tuning ratios which facilitate use of varactor diodes that do not have high tuning capacitance ratios. For example, in the case of the conventional UHF local oscillator, the tuning ratio T.R. is given as follows:

$$T.R. = (887+43)/(473+43) = (930)/(516) = 1.80$$

whereas in the present system, the UHF local oscillator has a tuning ratio given as follows:

$$T.R. = (887+230)/(473+230) = (1,117)/(703) = 1.59$$

The capacitance tuning ratio varies as the square of the tuning ratio values given so that the circuit performance factors are improved in the ratio of $(1.80/1.59)^2$ or 1.28.

Another advantage of the illustrated system is that varactor diodes, where used for image trap or signal rejection functions, are operating at frequencies substantially removed from the desired frequency, so that problems associated with low Q are alleviated.

Thus, while preferred constructional features of the invention are embodied in the structure illustrated herein, it is to be understood that changes and variations may be made by those skilled in the art without departing from the spirit and scope of the appended claims.

What is claimed is:

1. A television tuner arrangement comprising band pass filter means for selecting input signals within a predetermined band of television frequencies, means for converting an output signal derived from said filter means to provide an intermediate frequency signal in a predetermined intermediate frequency band that is above the VHF television band, said means for converting including local oscillator means having voltage controlled diode capacitance tuning means for providing an oscillator signal variable over a frequency band above the predetermined intermediate frequency band and mixer means coupled to receive said input signal and said oscillator signal to produce said intermediate frequency signal as a difference frequency signal, and means for converting said intermediate frequency signal to a television signal in an intermediate frequency band below the VHF television band and including local oscillator means for providing a fixed frequency oscillator signal and mixer means coupled to receive said intermediate frequency signal and said fixed frequency oscillator signal to produce said television signal as a difference signal.

2. A television tuner arrangement as defined in claim 1 wherein said intermediate frequency signal is about 230 MHz.

3. A television tuner arrangement as defined in claim 1 wherein said means for converting the input signal includes a local oscillator trap and the first-named mixer means comprises a balanced mixer.

4. An all channel television tuner arrangement comprising a VHF section for selecting input signals in the VHF television band and band converting the same in inverted relation to provide an intermediate frequency signal in a predetermined intermediate frequency band above the VHF television band, a UHF section for selecting input signals in the UHF television band and band converting the same in inverted relation to said intermediate frequency band, an IF section having an amplifier tuned to said predetermined intermediate frequency band and means coupled to said amplifier for converting said intermediate frequency signal to a television signal in an intermediate frequency band below the VHF television band and switching means selectively operable to couple output either from said VHF section or from said UHF section to said IF section.

5. A television tuner arrangement as defined in claim 4 wherein said intermediate frequency signal is about 230 MHz.

6. A television tuner arrangement as defined in claim 4 wherein said VHF section includes VHF local oscillator means having voltage controlled diode capacitance tuning means for providing a VHF oscillator signal of variable frequency and mixer means coupled to receive said VHF oscillator signal and the input signals corresponding to the VHF television band, and said UHF section includes UHF local oscillator means having voltage controlled diode capacitance tuning means for providing a UHF oscillator signal of variable frequency and mixer means coupled to receive said UHF oscillator signal and the input signals corresponding to the UHF television band.

7. A television tuner arrangement as defined in claim 6 wherein said predetermined intermediate frequency is about 230 MHz.

8. A television tuner arrangement as defined in claim 6 wherein each of said VHF AND UHF sections includes a separate tunable local oscillator trap tunable in conjunction with the corresponding local oscillator.

* * * * *

UNITED STATES PATENT OFFICE
CERTIFICATE OF CORRECTION

Patent No. 3,696,302 Dated October 3, 1972

Inventor(s) Thomas F. Gossard

It is certified that error appears in the above-identified patent and that said Letters Patent are hereby corrected as shown below:

Column 2, line 62: "turned" should be ----- tuned ---

Column 4, line 13: "output" should be ----- input ---

Column 6, line 4: "AND" should be ---- and ---

Signed and sealed this 6th day of March 1973.

(SEAL)
Attest:

EDWARD M.FLETCHER,JR.
Attesting Officer

ROBERT GOTTSCHALK
Commissioner of Patents